United States Patent [19]

Wilke et al.

[11] 4,434,550

[45] Mar. 6, 1984

[54] METHOD AND APPARATUS FOR INSERTION OF ELECTRICAL COMPONENTS INTO A CIRCUIT BOARD

[75] Inventors: Heinz Wilke, Diekholzen; Klaus-Uwe Fonck, Hildesheim, both of Fed. Rep. of Germany

[73] Assignee: Blaupunkt-Werke GmbH, Hildesheim, Fed. Rep. of Germany

[21] Appl. No.: 324,426

[22] Filed: Nov. 24, 1981

[30] Foreign Application Priority Data

Nov. 28, 1980 [DE] Fed. Rep. of Germany ....... 3044860

[51] Int. Cl.$^3$ .......................... H05K 3/00; B23P 19/00
[52] U.S. Cl. ........................................ 29/837; 29/739; 29/741
[58] Field of Search ................. 29/837, 739, 741, 832, 29/759, 760, 281.4, 469, 464, 825; 227/139, 150; 339/17 C

[56] References Cited

U.S. PATENT DOCUMENTS

| 3,257,711 | 6/1966 | Van Rijsewijk | 29/741 X |
| 3,319,324 | 5/1967 | Keller | 29/739 X |
| 3,443,298 | 5/1969 | Romeo | 29/741 X |
| 3,907,008 | 9/1975 | Bates et al. | 29/741 X |

FOREIGN PATENT DOCUMENTS

| 642776 | 1/1979 | U.S.S.R. | 29/837 |
| 775801 | 10/1980 | U.S.S.R. | 29/825 |

Primary Examiner—Howard N. Goldberg
Assistant Examiner—Carl J. Arbes
Attorney, Agent, or Firm—Frishauf, Holtz, Goodman & Woodward

[57] ABSTRACT

To increase the packing density of elements inserted into a printed circuit (PC) board 2, by placing such elements (3; 12, 13) close together without regard to the size or width of an insertion gripper (16) holding the element (3) to be inserted, a vertically reciprocable carrier (6) has tubes (8) secured thereto which are moved upwardly through insertion holes (4, 5) in the PC board (2), extending above the PC board, for insertion of the connecting leads or wires (7) of the element (3) into the tubes which, then, are withdrawn through the holes to permit the element (3) to follow the withdrawing tubes and seat the connecting wires in the holes, for subsequent attachment, for example by soldering. To facilitate insertion, a pair of horizontally movable semicircular alignment dies (10, 11) are moved towards the upper ends of the tubes (8) to facilitate insertion of the wires (7), for example by presenting flared or funnel-like openings (14, 15) leading towards the tubes (8).

7 Claims, 1 Drawing Figure

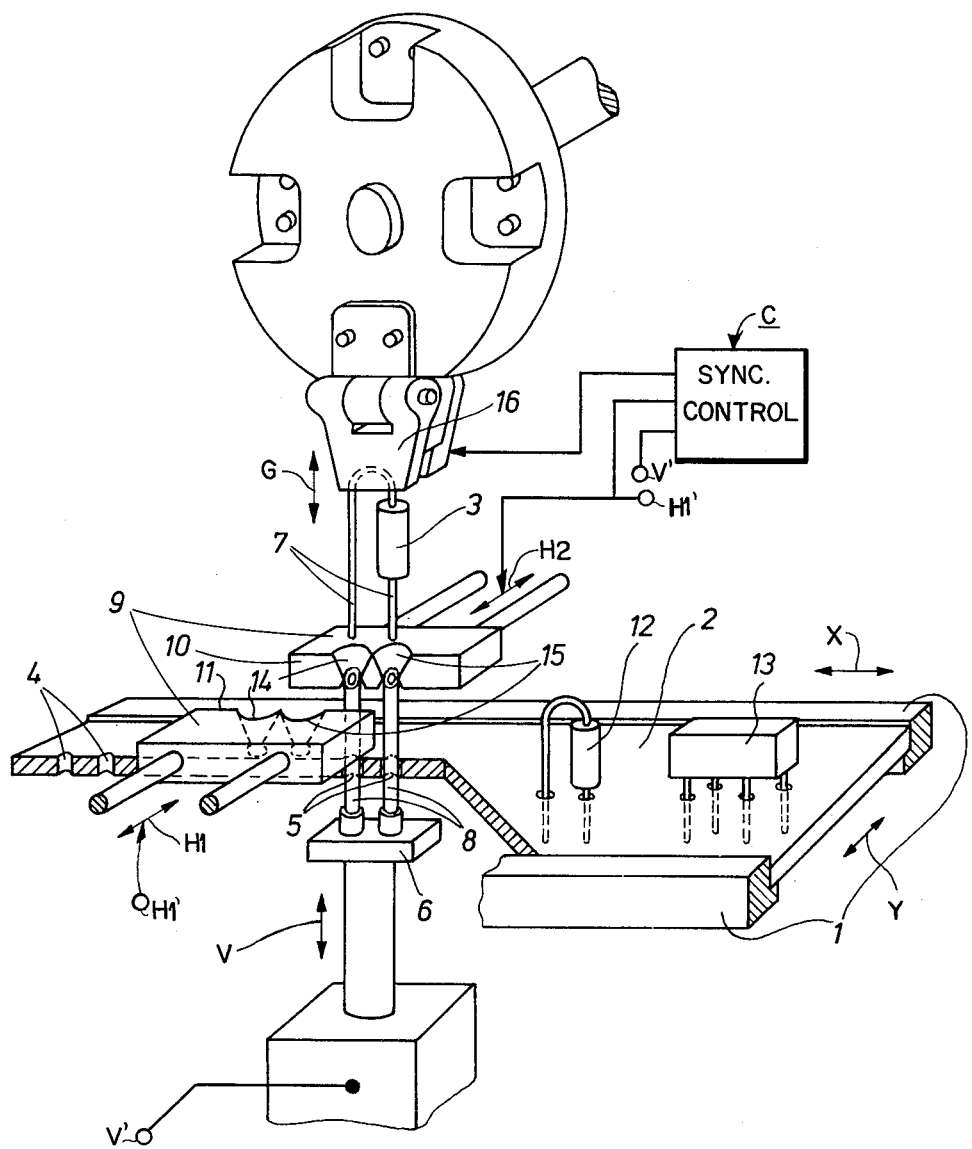

METHOD AND APPARATUS FOR INSERTION OF ELECTRICAL COMPONENTS INTO A CIRCUIT BOARD

The present invention relates to a method and apparatus to insert electrical network components, such as resistors, capacitors, transistors, and the like, into preformed holes of a printed circuit board, and more particularly to facilitate the insertion by automatic machinery.

BACKGROUND

Automatic insertion machinery for discrete electrical components in which the electrical components have their lead wires arranged to extend perpendicularly to the printed circuit (PC) board are known. In the customary method, the lead or connection wires of the printed circuit boards, aligned in parallel, are gripped by a gripper and introduced from above into the holes of PC board. The PC board, prior to the insertion, was located with respect to the insertion position by a locating mechanism, for example a transport which aligns the holes with the wires. It is not always possible for the insertion gripper to reliably meet the insertion hole; the aim of the insertion gripper may be slightly off, or the wires may bend. In order to insure reliable insertion, the connecting leads are held short, which requires the gripper to come close to the PC board. This does not permit, however, insertion of articles with a high packing density, since the space taken up by the grippers interferes with tight placement of the components. High packing density can be obtained only by sequential insertion, some of it possibly manually.

THE INVENTION

It is an object to provide a method and apparatus to permit insertion of electrical network components, especially of electronic components, such as transistors, resistors, capacitors, and the like, with high packing density, which is simple, reliable, and compatible with existing apparatus.

Briefly, the components are held in a gripper with the insertion pins or conductors extending towards the PC board. In accordance with the invention, a thin-walled tube is inserted from beneath the printed circuit board through the insertion opening to extend thereabove, and the component is inserted with the connecting leads or wires into the tubes which, then, are withdrawn from beneath the printed circuit board, thereby permitting the elements to drop through the holes of the PC board and seat thereon in predetermined position. The gripper, thus, can release the component at a suitable distance above the PC board, so that the size of the gripper of the component will not interfere with already positioned elements on the PC board.

The method and apparatus has the advantage that automatic insertion of PC boards is made possible in which the number of components, per unit area, can be substantially higher than previously possible, while still permitting entirely automatic insertion. Further, the system permits automatic insertion of components into an already prepared PC board, with components already placed and secured thereon, for example to add specific electrical circuit components for specific functions in selected models of a circuit which has previously been made by other production processes.

An insertion die is preferably provided, which may be formed of a pair of jaws with a funnel-like end form, placed at the upper side of the PC board, and fitting around the top ends of the tubes, which further facilitates insertion and, by flaring outwardly the die openings, permits slight misalignment of the insertion component while still providing for reliable insertion of the component into the predetermined positioning holes in the PC board.

DRAWING

The single FIGURE is a part-perspective view of the insertion apparatus, with a portion of the PC board broken away for clarity, in which all features not necessary for an understanding of the present invention have been omitted.

A holding frame 1—see the drawing—carries a printed circuit (PC) board 2, maintaining the PC board in horizontal position. The holding frame 1 is movable by an indexing system, in accordance with well known construction, to predetermined positions to align holes 4, 5, for example punched or bored, and extending through the PC board. The PC board is shown in section in the FIGURE, with the section extending through the holes or bores 4, 5.

In accordance with the invention, a vertically movable carrier or holder 6 is positioned beneath the PC board, having two thin-walled tubes 8 thereon which are spaced from each other to match the spacing of the bores 5, and which are dimensioned to receive the connecting leads or wires 7 of the component 3 to be inserted in the PC board. By vertically movement, in the direction of the double arrow, the tubes 8 are movable from beneath the PC board therethrough, and extending vertically thereover.

A pair of jaw-shaped die elements 10, 11, and forming, when moved towards each other in mating direction of the double arrows, an insertion alignment arrangement 9. The alignment arrangement 9 is provided to assist fit of the connecting wires or leads 7 into the tubes 8. The jaws 10, 11 are movable in a plane above the top surface of the PC board 2 and are positioned high enough to clear any circuit elements 12, 13 to be placed, or already placed, on the PC board. The jaws 10, 11 have flared, funnel-shaped upper openings 14, 15, and are so dimensioned that, when brought towards each other, they surround the upper portions of the tubes 8, each one of the jaws being formed with semicircular openings to cover half the circumference of the tubes 8.

The jaws may be formed with slightly recessed shoulders, so that the insertion opening from the funnel-shaped end portion, 14, 15 will merge smoothly with the inner opening of the tubes 8.

A vertically movable insertion gripper structure 16 is provided, located above the PC board 3 and above the alignment arrangement 9. The gripper 16 can be constructed in accordance with any well known and suitable manner, and inserts network components 3 with parallel, aligned connecting wires 7 by lowering the gripper 16 to introduce the wires 7 into the free ends of the tubes 8, guided by the holes 14, 15 of the insertion arrangement 9, and particularly and accurately aligned by guidance by the outer flared, funnel-shaped portions thereof.

It is equally possible to insert elements into a PC board which already has electronic components or elements such as resistors, capacitors, integrated circuits, and the like, secured thereto. To do so, the already preassembled PC board is introduced into the frame 1 and positioned by the guiding or transport control arrangement to which frame 1 is coupled—in accordance with well known arrangements—to place the PC board with holes 4, 5 at the insertion position. After the PC board 2 is in the predetermined position, the holder or carrier 6 is so raised that the tubes 8 are introduced into the holes 5 until the free ends thereof extend over and beyond the components 12, 13 already inserted in the PC board. Thereafter, the jaws 10, 11 of the alignment arrangement 9 are moved towards each other and to the ends of the tubes 8 such that the bores 14, 15 in the jaws 10, 11 form closed flared insertion and alignment funnels, which surround the upper ends of the tubes with the narrow necks of the funnels. By downward movement of the gripper 16, the end of previously parallel positioned connecting leads 7 of element 3 are introduced into the open ends of the tubes 8. The insertion and alignment arrangement 9 facilitates alignment and guidance.

As soon as the wires 7 of the element 3 are introduced in the tubes 8, the gripper 16 releases the element 3, and the alignment arrangement 9 likewise moves outwardly, away from the tubes, to release the tubes 8. The holder or carrier 6 is then moved downwardly, with the wires 7 of the element 3 still in the tubes 8, and withdrawn below the PC board, leaving the element 3 above the PC board, with the wires 7 extending through the holes 5 of the PC board 2. This, then, positions the element 3 on the PC board 2. Further attachment and electrical connection of the element 3 is done by any well known and suitable system, for example by wave soldering or the like.

The connecting wires 7 of the elements may be formed with shoulders or seats or stops if it is desired to position the respective elements by a predetermined distance above the PC board, as known.

Various changes and modifications may be made; the invention is not limited to the insertion of components having two connecting wires; rather, any components with any number of connecting leads may be used, and single wires which can drop freely, for example to form a connection, may be inserted in a similar manner.

Further suitable auxiliary apparatus may be used. The FIGURE shows, highly schematically, a synchronization control unit C, which provides for synchronized operation of the tube holder 6 in accordance with the vertical double arrow V, the jaws 10, 11, in accordance with the horizontal double arrows H1, H2, and the movement of the gripper in accordance with the double arrow G. The synchronization control unit C is connected to effect the synchronized operation of the respective elements, as schematically indicated by the output arrows from the control unit C to the respective elements or arrows, at terminals H1', V', for example. The carriage 1 can move the PC board 2 in an X-Y direction, as shown by the double arrows X, Y, in accordance with standard X-Y positioning technology.

What we claim is:

1. Method of insertion of electrical network components (3), having at least one connection wire (7), into a printed circuit board (2) formed with receiving holes (4, 5) therethrough,
in which the network components are gripped by an insertion gripper (16) and moved towards the printed circuit board, with the at least one wire thereof extending essentially perpendicularly to the plane of the printed circuit board,
and in which the printed circuit board is aligned with respect to the at least connection wire so that the receiving holes are in essential alignment therewith,
comprising, in accordance with the invention, the steps of guiding at least one thin-walled tube (8) to and through the holes (4, 5) of the printed circuit board from the side remote from said gripper means (16) until the at least one tube extends out of the plane of the printed circuit board at the side close to the gripper means and beyond said plane;
introducing the at least one connection wire (7) into the at least one tube (8) by moving the gripper means towards the printed circuit board;
releasing the network component from the gripper means to permit the component, with the at least one connection wire in the tube, to drop;
and withdrawing the tube (8) from the hole to thereby introduce the at least one connection wire into the hole, and continuing to withdraw the at least one tube until it clears the connection wire.

2. Method according to claim 1, further including the step of
laterally guiding the at least one connection wire, as it is being moved towards the already inserted tube, by placing a funnel-shaped guidance arrangement (9, 10, 11) adjacent the outer end of the tube (8) projecting through the printed circuit board (2).

3. Method according to claim 2, further including the steps of
withdrawing said guidance arrangement from contact with the ends of the tubes (8) substantially concurrently with release of the element (3) by the gripper means, and withdrawal of the tubes (8) from extension above the printed circuit board (2).

4. Apparatus for insertion of electrical network components (3) having at least one connection wire (7) into a printed circuit board (2) formed with at least one receiving hole (4, 5) therethrough,
and having an insertion gripper means (16) positioned above the printed circuit board, and movable towards the printed circuit board, for gripping a network component (3) with its insertion wire (7) extending essentially perpendicularly to the plane of the printed circuit board, and in alignment with a receiving hole (4, 5) through the printed circuit board,
comprising, in accordance with the invention,
a holder or carrier (6) positioned below the printed circuit board, and movable upwardly towards the printed circuit board;
a thin-walled tube (8) extending upwardly from the holder or carrier and in alignment with the receiving hole (4, 5) and of sufficient length to extend upwardly through and beyond the upper surface of the printed circuit board upon movement of the holder or carrier to an upper position, while clearing the printed circuit board upon movement of the holder or carrier (6) to a lower position to permit introduction of the tube (8) through the hole and insertion of the connection wire (7) of the component into the tube (8) extending above and beyond the upper surface of the printed circuit board, and subsequent withdrawal of the tube through the hole (4, 5) and lowering of the component towards the top surface of the printed circuit board, and subsequent withdrawal of the tubes (8) from the printed circuit board to effect positioning of the connection wire (7) through the hole (4, 5) of the printed circuit board.

5. Apparatus according to claim 4, further comprising an alignment arrangement (9, 10, 11) positioned above the printed circuit board and in alignment with and adjacent to the end portion of the tube (8) when the tube extends through the holes (4, 5) in the printed circuit board and beyond the upper surface thereof.

6. Apparatus according to claim 5, wherein the alignment arrangement (9) comprises a pair of jaws (10, 11) horizontally movable with respect to the printed circuit board in a plane above the printed circuit board and at sufficient distance thereabove to clear components (12, 13) inserted therein;

and at least one upwardly flaring, funnel-shaped bore (14, 15), said jaws surrounding the upper portion of the tube by a semicircle, each, said jaws, when placed towards each other and surrounding a tube, forming a closed upwardly flaring funnel-shaped alignment opening for introduction of the connecting wire therein and subsequent insertion into the tube (8).

7. Apparatus according to claim 5, further including a synchronization control unit (C) synchronizing operation of the gripper means (16), the alignment arrangement (6) and the tube holder to effect outward movement of the tube holder (6) and introduction of the tube (8) through the hole (4, 5), subsequent placement of the alignment arrangement (9) around the then projecting upper end portion of the tube (8), lowering of the gripper (16) and insertion of the connection wire (7) through the alignment arrangement (9) into the tube, and subsequent release of the component (3) from the gripper, withdrawal of the alignment arrangement, and lowering of the tube holder, with the elements dropping towards the printed circuit board and the connection wire being introduced through the hole (4, 5) upon subsequent withdrawal of the tube (8) from the hole (4, 5).

* * * * *